United States Patent [19]
Nishizawa

[11] Patent Number: 5,404,812
[45] Date of Patent: Apr. 11, 1995

[54] MECHANICAL ACCELERATION SENSOR AND GAS-PRESSURE ACTIVATING APPARATUS EMPLOYING THE SAME

[75] Inventor: Muneo Nishizawa, Shiga, Japan

[73] Assignee: Takata Corporation, Tokyo, Japan

[21] Appl. No.: 88,929

[22] Filed: Jul. 7, 1993

[30] Foreign Application Priority Data

Jul. 8, 1992 [JP] Japan .................................. 4-203251

[51] Int. Cl.⁶ .......................... F42C 1/04; B60R 21/08;
C06D 5/00; H01H 35/14
[52] U.S. Cl. ...................................... 102/274; 280/734
[58] Field of Search .................... 102/274, 272, 275.11;
280/734, 741, 737

[56] References Cited

U.S. PATENT DOCUMENTS

| | | | |
|---|---|---|---|
| 4,938,140 | 7/1990 | Kinoshita et al. | 102/274 |
| 5,080,394 | 1/1992 | Mori et al. | 280/734 |
| 5,092,628 | 3/1992 | Tamura et al. | 280/734 |
| 5,188,393 | 2/1993 | Föhl | 280/734 |
| 5,197,757 | 3/1993 | Breed et al. | 280/734 |
| 5,279,227 | 1/1994 | Nishizawa | 102/274 |

*Primary Examiner*—David Brown
*Attorney, Agent, or Firm*—Brumbaugh, Graves, Donohue & Raymond

[57] ABSTRACT

A mechanical acceleration sensor having a weight movably supported on a casing, a latch lever loaded with a set load and disposed to face the weight, and a firing pin spring-loaded and engaged with the latch lever. The latch lever is disengaged from the firing pin against the set load by inertial movement of the weight relative to the casing, thereby allowing the firing pin to perform a percussive action. A sub-lever is provided in connection with the latch lever. The sub-lever is disposed to face a side of the weight which is opposite to the side thereof that faces the latch lever so as to cooperate with the latch lever to clamp the weight from both sides of the direction of inertial movement of the weight, thereby making it possible to sense acceleration acting on the sensor in both the positive and negative directions of inertial movement of the weight by the inertial movement thereof.

6 Claims, 7 Drawing Sheets

MECHANICAL ACCELERATION SENSOR AND GAS-PRESSURE ACTIVATING APPARATUS EMPLOYING THE SAME

BACKGROUND OF THE INVENTION

The present invention relates to a mechanical acceleration sensor for activating a gas generator of an inflator in an air bag system or a pretensioner in a seatbelt system. The present invention also relates to a gas-pressure activating apparatus employing the mechanical acceleration sensor.

Vehicles, for example, automobiles, are provided with an air bag system or a seatbelt system. For an inflator in the air bag system or a pretensioner in the seatbelt system, a gas generator is employed as a means of generating a driving medium for the inflator or the pretensioner. The gas generator is activated by an acceleration sensor which operates on sensing a predetermined level of acceleration. Such acceleration sensors include two types, that is, a sensor that outputs an electric signal, and a mechanical sensor that outputs a mechanical displacement of a member. The former is superior in the acceleration pulse discriminating power and hence advantageous in that an erroneous operation is unlikely to occur. On the other hand, it requires a power supply and electrical connection. Therefore, the installation position is limited. In contrast, the latter acceleration sensor is inferior to the former in the acceleration pulse discriminating power, but it is less costly and needs no electric supply nor electrical connection. Therefore, the latter type of acceleration sensor is advantageous in that it can be used without limitation on the installation position. Under these circumstances, various proposals have heretofore been made with regard to the mechanical sensor.

There is one form of such mechanical sensor in which when a predetermined level of acceleration acts on the vehicle, a firing pin of the sensor is percussively actuated to activate the inflator of the air bag system. This type of mechanical sensor has a weight, a latch lever, and a firing pin, which are movably supported on a sensor casing. The firing pin, which is spring-loaded, is released from the hold by the latch lever by the inertial movement of the weight relative to the casing, thereby allowing the firing pin to perform a percussive action (for example, see Japanese Utility Model Application Laid-Open (KOKAI) No. 2-32464, in which, particularly, the position of the weight relative to the latch lever is adjustable.)

However, the above-described conventional mechanical sensor is originally intended to be applied to an air bag. Therefore, in the conventional mechanical sensor, the acceleration sensing direction, that is, the direction of inertial movement of the weight, is set in only one direction. For example, if this mechanical sensor is used as a means for activating a pretensioner attached to a retractor in a seatbelt system, the set-up posture of the mechanical sensor relative to the retractor must be reversed depending upon whether the retractor is installed on the left-hand side of the right-hand side with respect to the vehicle. The limitation on the set-up posture necessitates preparation of different kinds of mechanical sensor in accordance with the position in which the retractor is installed.

Further, in the conventional mechanical sensor, the weight is movably supported on the casing relatively loosely. Therefore, it is difficult to expect an accurate operation, and the operation is readily influenced by the set-up posture of the sensor. In addition, since the space for the operation of the latch lever and the space for the movement of the weight must be provided separately from each other, the outer shape and overall weight of the sensor become large in comparison to the weight of the weight member.

SUMMARY OF THE INVENTION

The present invention has been made in view of the above-described circumstances, and it is a first object of the present invention to provide a mechanical acceleration sensor which is designed so that the restrictions on the set-up position and set-up posture of the sensor are eliminated as many as possible.

In addition, it is a second object of the present invention to provide a mechanical acceleration sensor having sensitivity with which it can respond to acceleration acting in both the direction of acceleration and the direction of deceleration.

In addition, it is a third object of the present invention to provide a mechanical acceleration sensor which enables initial setting for adjusting the position of engagement between the latch lever and the firing pin after the sensor has been set up.

In addition, it is a fourth object of the present invention to provide a mechanical acceleration sensor having a compact overall configuration in comparison to the dimensions of the weight member.

In addition, it is a fifth object of the present invention to provide a mechanical acceleration sensor in which the initial set position is constantly maintained by virtue of a lowering in the friction occurring between engagement portions, thereby realizing a stable operation.

In addition, it is a sixth object of the present invention to provide a gas-pressure activating apparatus employing any of the above-described mechanical acceleration sensors, in which leakage of gas is prevented by a common seal means, which is provided by connecting together the sensor and a gas generator, without the need for providing a special seal means on the sensor.

To attain the above-described objects, the present invention provides a mechanical acceleration sensor having a weight movably supported on a casing, a latch lever loaded with a set load and disposed to face the weight, and a firing pin spring-loaded and engaged with the latch lever, so that the latch lever is disengaged from the firing pin against the set load by inertial movement of the weight relative to the casing, thereby allowing the firing pin to perform a percussive action. The sensor includes a sub-lever provided in connection with the latch lever. The sub-lever is disposed to face a side of the weight which is opposite to the side thereof that faces the latch lever so as to cooperate with the latch lever to clamp the weight from both sides of the direction of inertial movement of the weight.

In addition, the present invention provides a mechanical acceleration sensor having a weight movably supported on a casing, a latch lever loaded with a set load and disposed to face the weight, and a firing pin spring-loaded and engaged with the latch lever, so that the latch lever is disengaged from the firing pin against the set load by inertial movement of the weight relative to the casing, thereby allowing the firing pin to perform a percussive action. The sensor includes setting means disposed in connection with the latch lever for enabling the position of engagement between the latch lever and the firing pin to be adjusted from the outside of the casing.

In addition, the present invention provides a mechanical acceleration sensor having a weight movably supported on a casing, a latch lever loaded with a set load and disposed to face the weight, and a firing pin spring-loaded and engaged with the latch lever, so that the latch lever is disengaged from the firing pin against the set load by inertial movement of the weight relative to the casing, thereby allowing the firing pin to perform a percussive action. The weight is supported on the casing through a guide member that prevents rotation of the weight about the axis in the direction of inertial movement thereof.

In addition, the present invention provides a mechanical acceleration sensor having a weight movably supported on a casing, a latch lever loaded with a set load and disposed to face the weight, and a firing pin spring-loaded and engaged with the latch lever, so that the latch lever is disengaged from the firing pin against the set load by inertial movement of the weight relative to the casing, thereby allowing the firing pin to perform a percussive action. The latch lever is engaged with the firing pin through a roller.

In addition, the present invention provides a gas-pressure activating apparatus employing one of the above-described mechanical acceleration sensors, in which the mechanical acceleration sensor is connected to a gas generator with the casing attached to a housing of the gas generator, and wherein a coupler seal is disposed in the joint of the housing and the casing to prevent a gas generated by the gas generator when activated from leaking out through the joint.

In the above-described mechanical acceleration sensors of the present invention and the gas-pressure activating apparatus of the present invention which employs one of the mechanical acceleration sensors, first, the sub-lever is provided in connection with the latch lever so that these levers cooperate with each other to clamp the weight from both sides of the direction of inertial movement of the weight. With this arrangement, acceleration acting on the sensor in both the positive and negative directions of inertial movement of the weight can be sensed by the inertial movement thereof. It is a matter of course that the above-described arrangement does not prevent the sensor from being used in such a way that the inertial movement of the weight in a particular direction is prevented to limit the sensitivity to only one direction.

Next, the arrangement, in which the set means is disposed in connection with the latch lever, enables setting in which the position of engagement between the latch lever and the firing pin is adjusted by externally actuating the setting means after the sensor has been set up.

The arrangement, in which the weight is supported on the casing through the guide member that prevents the rotation of the weight about the axis in the direction of inertial movement thereof, prevents the weight from rotating whether it is in a set state or in an operative state. Accordingly, there is no possibility of the weight interfering with another member by the influence of the set-up posture of the sensor.

Further, the arrangement, in which the latch lever is engaged with the firing pin through the roller, minimizes the frictional resistance produced in the area of engagement between the latch lever and the firing pin. Therefore, when the sensor is in an inoperative state, the position of engagement between the latch lever and the firing pin is maintained in the initial set position, and the latch lever can move smoothly from the set position to the release position without being substantially influenced by frictional force.

In addition, by virtue of the arrangement in which the coupler seal is disposed in the joint of the housing of the gas generator and the casing of the mechanical acceleration sensor, the gas generated by the gas generator when activated is prevented from leaking out through the joint by the coupler seal common to the gas generator and the mechanical acceleration sensor.

The mechanical acceleration sensor and gas-pressure activating apparatus employing the same according to the present invention provide the following advantageous effects. First, in the mechanical acceleration sensor according to the present invention the latch lever and the sub-lever are coupled to each other to clamp the weight, and the firing pin is activated by the movement of the weight in either direction. Accordingly, the sensor can be endowed with sensitivity in both the direction of acceleration and the direction of deceleration. According to the use application, it is also possible to use the sensor in such a way that the movement of the weight in either of the directions is prevented to thereby disable the sensitivity to acceleration acting in the other direction.

Next, in the mechanical acceleration sensor of the present invention, the position of the latch lever relative to the firing pin can, preferably, be adjusted externally after the sensor has been set up. Accordingly, the setting operation is facilitated, and the sensor setting-up operation is also facilitated.

Further, in the mechanical acceleration sensor according to the present invention, since the rotation of the weight is prevented, it can be disposed in close proximity to or in complicated relation to other constituent elements. Accordingly, it is possible to reduce the overall size of the sensor by rationally arranging the constituent elements. In addition, since it is possible to avoid interference between the weight and other constituent elements during the movement of the weight, a set-up posture of the sensor, including an apparatus to which the sensor is attached, can be selected as desired according to the use application.

In the mechanical acceleration sensor of the present invention, the frictional resistance produced in the area of engagement between the latch lever and the firing pin is minimized. Therefore, it is possible to improve the performance of returning the latch lever to the set position after slight movement thereof which did not cause a percussive action of the firing pin. Accordingly, the position of engagement between the latch lever and the firing pin can be maintained in a predetermined position at all times. Thus, the sensitivity of the sensor can be stabilized. With the improvement in the performance of returning the latch lever to the set position, it is also possible to reduce the set load. Accordingly, it is possible to reduce the weight and size of each of the parts, including the weight, and hence possible to arrange the whole sensor in a compact form.

Finally, in the gas-pressure activating apparatus of a preferred form of the present invention, leakage of the gas from the gas generator to the sensor can be prevented with a single element by employing a coupler seal. Accordingly, the pressure of gas generated by the gas generator can be efficiently supplied to an actuating part that requires it.

DETAILED DESCRIPTION OF THE PREFERRED EMBODIMENTS

One embodiment in which the mechanical acceleration sensor of the present invention is applied to a pretensioner to form a gas-pressure activating apparatus therefor will be described below with reference to the accompanying drawings. As shown in the sectional side view of FIG. 1, the mechanical acceleration sensor (referred to simply as "sensor" in the following description of the embodiment) has a weight 2 movably supported on a casing 1, a latch lever 3 loaded with a set load and disposed to face the weight 2, and a firing pin 4 spring-loaded and engaged with the latch lever 3. In addition, a sub-lever 5 is provided in connection with the latch lever 3. The sub-lever 5 is disposed to face a side of the weight 2 which is opposite to the side thereof that faces the latch lever 3. Accordingly, the sub-lever 5 cooperates with the latch lever 3 to clamp the weight 2 from both sides of the direction of inertial movement of the weight 2. The weight 2 is movably supported on the casing 1 through a guide member 6 that prevents the rotation of the weight 2 about the axis in the direction of inertial movement thereof. The latch lever 3 is engaged with the firing pin 4 through a roller 35. The sensor, arranged as described above, is connected to the gas generator 91 with the casing 1 attached to a housing 90 of a pretensioner 9. A coupler seal 8 is disposed in the joint of the housing 90 and the casing 1 to prevent the gas generated by the gas generator 91 when activated from leaking out through the joint. The sensor is arranged such that the engagement between the latch lever 3 and the firing pin 4 is canceled by the inertial movement of the weight 2 relative to the casing 1, thereby allowing the firing pin 4 to perform a percussive action.

The details of the arrangement of the sensor will be explained below more specifically with reference to FIG. 1 and FIG. 2, which is an exploded perspective view showing each of the constituent members (although the positional relationship will be explained below on the assumption that the direction of the percussive action of the firing pin 4 is the forward direction for the sake of convenience, it should be noted that the positional relationship of the sensor to the vehicle is not limited thereto). First, the casing 1 includes a body 10 in the form of a square cylinder the rear end of which is open, and a lid 19 that closes the open rear end of the body 10. An outwardly extending plate-shaped flange 11 is provided on the forward end of the body 10 to constitute a joint to the housing 90. The flange 11 is formed with three screw receiving holes for attaching the casing 1 to the housing 90. A stepped hole 121 extends through the upper part of the front wall 12 of the body 10 to constitute a hole for receiving the firing pin 4. The stepped hole 121 has an enlarged-diameter portion at the forward end thereof which is defined as a portion for connection with the housing 90. The center of the front wall 12 of the body 10 is formed with a pair of left and right slide bar support holes 122. Slightly below the middle between the slide bar support holes 122 are formed a set screw hole 123 and a spring seat hole 124 which is contiguous with it. The bottom wall 13 of the body 10 is formed with a pair of longitudinally spaced adjust screw holes 131 and 132. Outward crowned thick-wall portions of the upper and bottom walls 14 and 13 of the body 10 are formed with a pair of screw holes, respectively, which are cut from the rear ends thereof. It should be noted that the two side walls of the body 10 are formed with a pair of mutually facing grooves 15, which are enlarged in width at the rear end portions thereof to constitute portions for supporting the respective ends of a small-diameter pin 30 and a large-diameter pin 50, which support the latch lever 3 and the sub-lever 5 in such a manner that these levers are rotatable back and forth. The lid 19 is formed with a pair of screw receiving holes corresponding to the above-described pair of screw holes formed in the body 10. The lid 19 is also formed with a spring seat projection 194 having a support hole 193 whose axis is coincident with the axis of the above-described stepped hole 121, and a pair of left and right support holes 195 whose axes are coincident with the respective axes of the above-described slide bar support holes 122.

The weight 2 has a square cylindrical configuration and is provided in the center thereof with a cut 21 extending over from the front side to the halfway position on the rear side through the upper side to constitute a space for accommodating the latch lever 3 and the sub-lever 5. It should be noted that cut portions are provided at the forward and rear ends of the upper side of the weight 2 in order to avoid interference with the support pins 30 and 50 for the latch lever 3 and the sub-lever 5. The weight 2 is formed with a pair of slide bar receiving holes 22 longitudinally extending through the weight 2. The lower side of the weight 2 is formed with a groove 23 of trapezoidal cross-section which has tapered front and rear walls.

The latch lever 3 is formed in an L-shape having a pair of arms, and the bent portion of the latch lever 3 is pierced with the support pin 30 so that the latch lever 3 is rotatable about the pin 30. The portion of one arm that faces the spring seat hole 124 is formed with a projection 31 for positioning the arm-side end portion of a set spring 33. The rear side of this portion of the arm is formed with a projection 32 which faces the front side of the weight 2. The distal end of the other arm is formed with an involute tooth 34. A roller 35, which functions as a bearing, is supported through a pin 36 in a cut portion formed in the center of the upper portion of the distal end of the arm.

The sub-lever 5 is similarly formed in an L-shape having a pair of arms, and the bent portion of the sub-lever 5 is pierced with the support pin 50 so that the sub-lever 5 is rotatable about the pin 50. The front side of one arm is formed with a projection 51 which faces the rear side of the weight 2. The distal end of the other arm is formed with an involute tooth 52 which is meshed with the involute tooth 34 formed at the distal end of the one arm of the latch lever 3.

The firing pin 4 is sharpened at the forward end thereof in order to concentrate points of impact against a percussion cap. The center of the firing pin 4 is formed with a collar 40 which serves an engagement portion with the latch lever 3 and also serves as a spring seat. The front surface of the collar 40 is formed as a concave conical surface 401 having a curvature corresponding to the curvature of the outer peripheral surface of the roller 35. The rear end of the collar 40 is reduced in diameter to constitute a spring seat for a firing spring 41.

Figure 1:
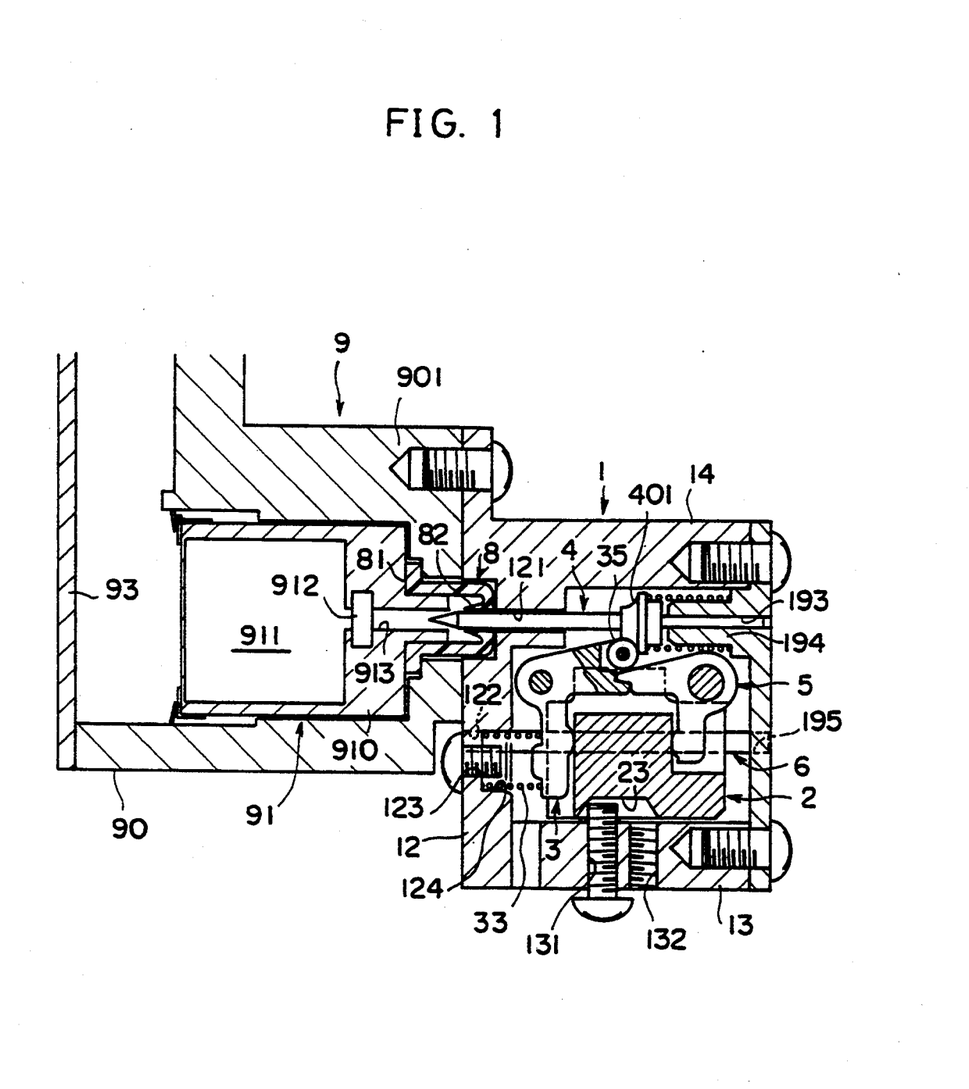
FIG. 1 is a sectional side view of one embodiment in which the present invention is applied to a mechanical acceleration sensor for a pretensioner in a seatbelt system.
Figure 2:
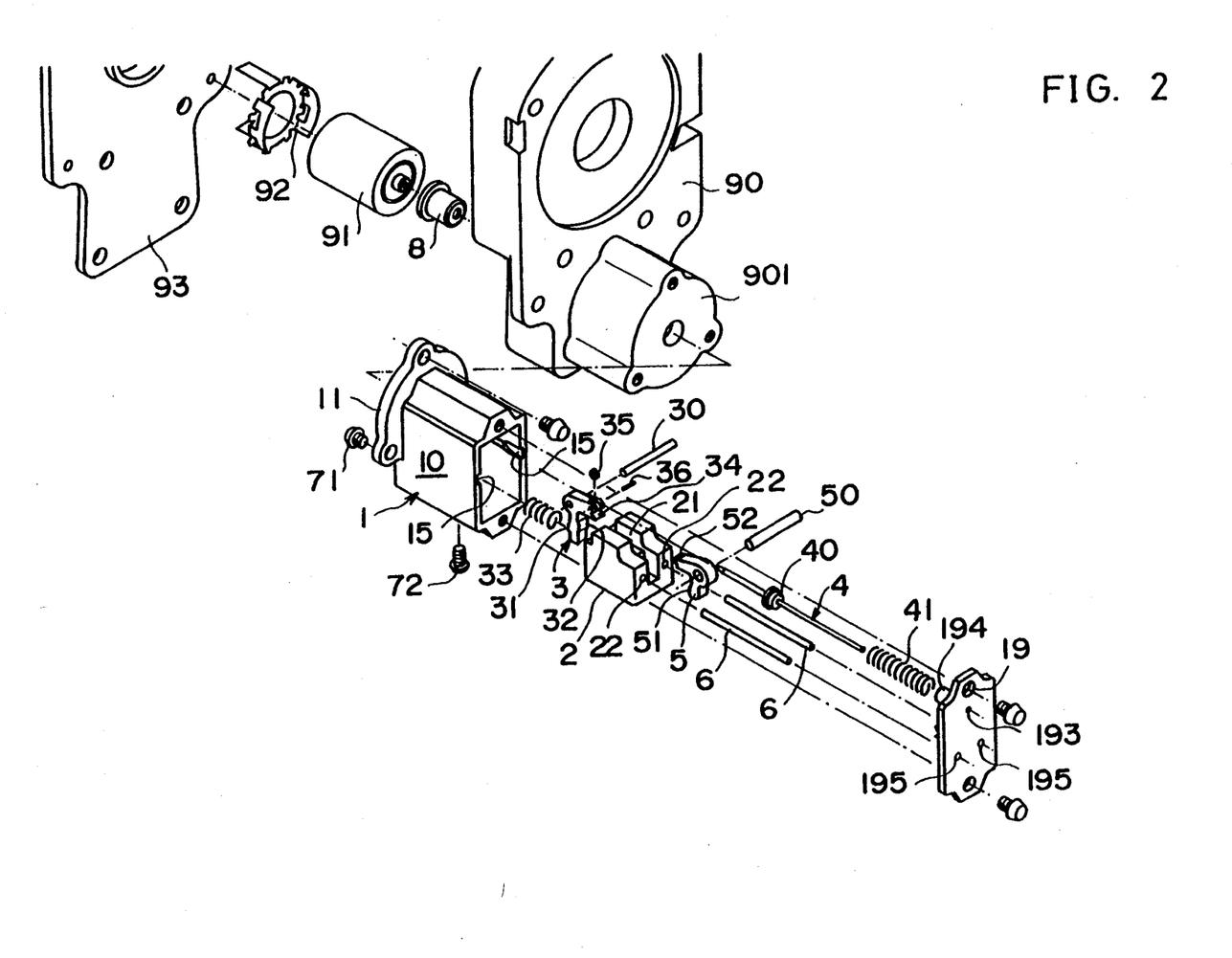
FIG. 2 is an exploded perspective view of the embodiment.
Figure 3A:
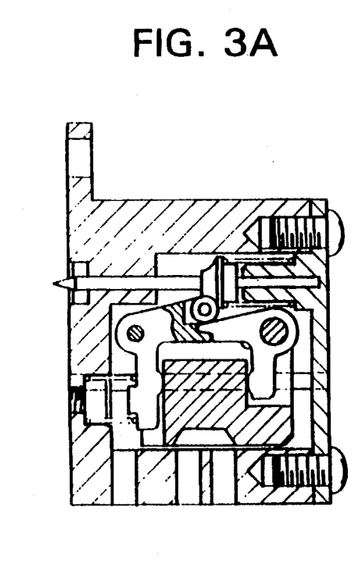
FIGS. 3A to 3D are a sectional side views sequentially showing a setting procedure for the mechanical acceleration sensor of the embodiment.
Figure 3B:
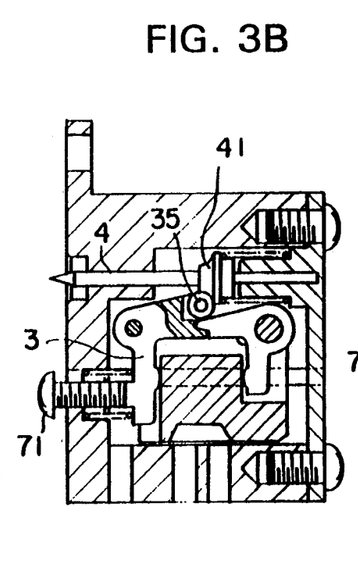
Figure 3C:
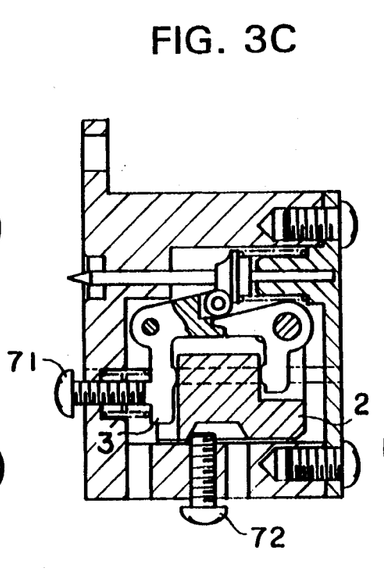
Figure 3D:
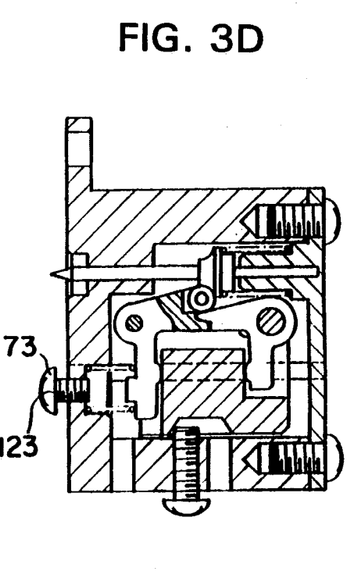

FIGS. 1 and 2 also show the positional relationship between the sensor, arranged as described above, and the pretensioner 9 when the former is attached to the latter. A coupler seal 8, which is a seal member integrated with a coupler, is interposed in a joint which is surrounded by the opening of the housing 90 and the stepped hole 121 of the casing 1. The gas generator 91 is accommodated in a cylindrical portion 901 of the housing 90 of the pretensioner 9. The forward end of the gas generator 91 is fastened by a snap ring 92. It should be noted that reference numeral 93 denotes a lid of the housing 90, 911 gunpowder charged in a generator casing 910, 912 a percussion cap buried at the rear of the gunpowder 911, and 913 an approach hole for the firing pin 4. The coupler seal 8 has at the forward end thereof an outward seal flange 81 which is clamped between the gas generator casing 910 and the housing 90, and at the rear end thereof a tubular seal lip 82 which extends forwardly through an inward flange portion. The seal lip 82 is reduced in thickness at the distal end thereof. When the firing pin 4 is in a set state, the distal end thereof extends through the seal lip 82 to reach the rear end of the gas generator casing 910.

The sensor, arranged as described above, is set by a setting procedure as shown in FIG. 3. FIG. 3(A) shows the sensor in an assembled state before setting, in which each member has been incorporated in a predetermined positional relationship. In this state, the adjust screw 71, which constitutes a setting means 7 for the latch lever 3, is screwed in, as shown in FIG. 3(B), by using a torque driver or the like, which tightens the screw 71 with a predetermined level of torque. Consequently, the roller 35 is correctly positioned with respect to the concave conical surface of the collar 40 of the firing pin 4. In this state, the adjust screw 72, which constitute a setting means 7 for the weight 2, is tightened, as shown in FIG. 3(C), by using a torque driver or the like in the same way as the above. Consequently, the weight 2 is pressed against the latch lever 3, so that the clearance therebetween disappears. Thus, the weight 2 is set in position without play. Finally, the adjust screw 71 is removed, and thus the setting is completed. Thereafter, another short screw 73 is screwed into the screw hole 123 to close the opening. Thus, all the settings of the sensor can be effected simply by controlling the torque externally applied by a screwing operation without the need for visual observation.

Figure 4A:
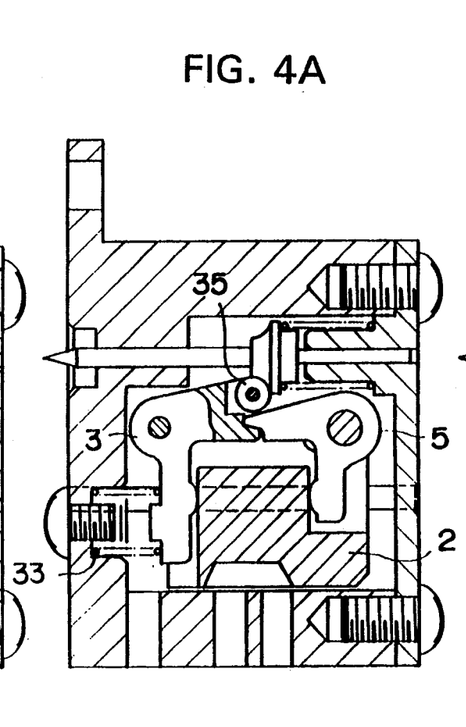
FIGS. 4A to 4C are a sectional side views showing operations of the sensor of the embodiment which take place in accordance with positive acceleration and negative acceleration, respectively.
Figure 4B:
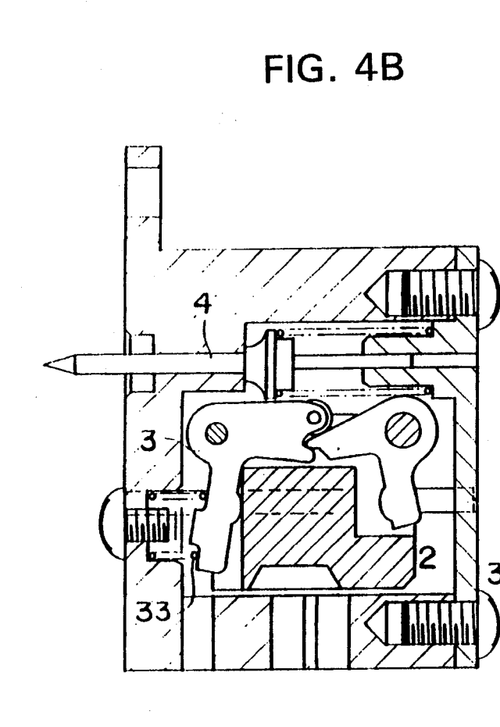
Figure 4C:
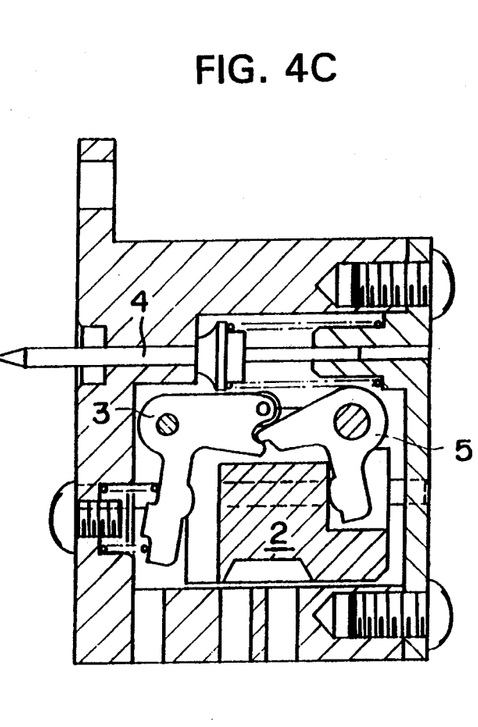

This sensor can be operated in various set conditions and in various set-up postures. These will be explained below in order. First, FIG. 4 shows the sensor set so as to be capable of operating in response to both acceleration and deceleration. In this case, the adjust screw 72, which has been mounted to press the weight 2 against the latch lever 3 so that there is no play therebetween, is removed, as shown in FIG. 4(A). In this set condition, if acceleration which exceeds a set value acts on the sensor in the direction of deceleration at the time of a collision or other similar accident, the weight 2 moves forward relative to the latch lever 3 against the load applied from the set spring 33, as shown in FIG. 4(B). As a result, the latch lever 3 and the firing pin 4 are disengaged from each other. On the other hand, if excessive acceleration acts on the sensor in the direction of acceleration due to a rear-end collision or other similar accident, the weight 2 moves backward relative to the latch lever 3, as shown in FIG. 4(C). In this case, the inertia acting on the weight 2 causes the sub-lever 5 to rotate counterclockwise as viewed in the figure, which, in turn, causes the latch lever 3 meshed with the sub-lever 5 to rotate clockwise. Consequently, a similar latch lever action takes place. Thus, the firing pin 4 disengages from the latch lever 3.

Figure 5:
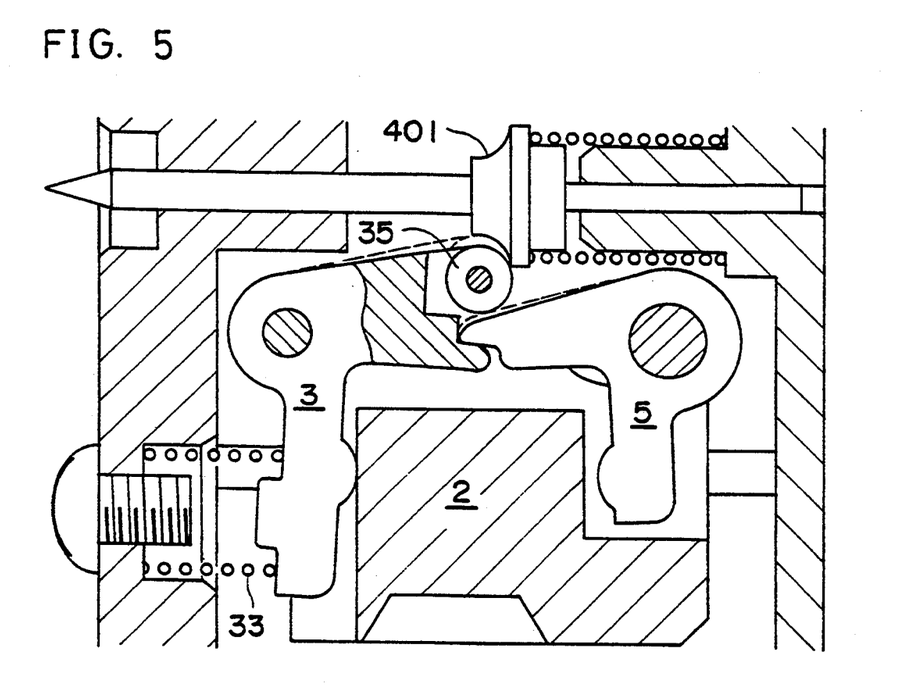
FIG. 5 is a sectional side view showing an operation in which the sensor of the embodiment returns to the set position.

Incidentally, in this sensor the latch lever 3 and the firing pin 4 are engaged with each other through the roller 35, and therefore the frictional resistance produced in the area of engagement between the latch lever 3 and the firing 4 is extremely small. Consequently, the sensitivity of the sensor can be determined substantially only by the spring load of the set spring 33. Since the control of the spring load is easier than that of the frictional resistance, this arrangement is useful to obtain an accurate set load. In addition, even in a case where the engagement portions are dislocated due to slight movement of the weight 2 caused by the action of acceleration which does not exceed the set value, the above-described arrangement ensures an operation in which the point of engagement automatically returns to the previous set position when the acceleration disappears. More specifically, as shown in FIG. 5, if the weight 2 is moved by the action of a certain level of acceleration, the latch lever 3 rotates clockwise, causing the point of contact between the roller 35 and the concave conical surface 401 to shift toward the outer peripheral side of the concave conical surface 401. When the acceleration disappears thereafter, the latch lever 3 is rotated in the direction for return by the spring load applied from the set spring 3. Accordingly, the weight 2 is also moved backwardly by the pushing action of the latch lever 3. Eventually, the point of engagement reaches the original position, shown by the two-dot chain line in the figure, and at this time, the weight 2 is immovably clamped between the latch lever 3 and the sub-lever 5. Thus, the point of engagement is prevented from shifting further from the original position. Accordingly, the sensor of this embodiment enables the set position to be properly maintained at all times.

Figure 6:
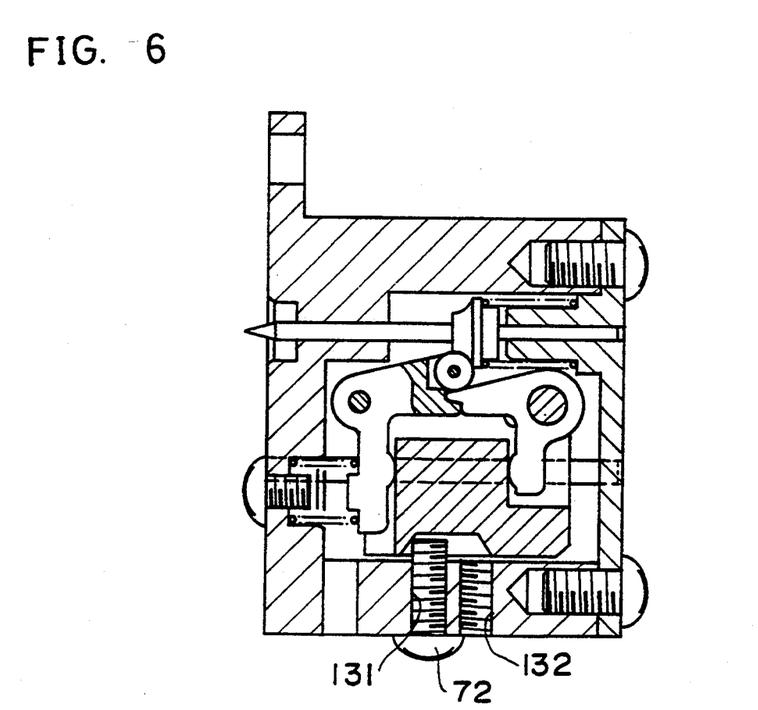
FIG. 6 is a sectional side view showing a mode of using the sensor of the embodiment in which the acceleration sensing direction of the sensor is matched with the set-up posture thereof and limited.

FIG. 6 shows that the acceleration sensing direction can be matched with the set position of the sensor regardless of whether it is set to face forward or backward. Such setting is made by determining which one of the pair of adjust screw holes 131 and 132 of the casing 1 should be selected to be engaged with the adjust screw 72. By doing so, the adjust screw 72 functions as a stopper that limits the movement of the weight 2 in the opposite direction. This setting is used, for example, in a case where two sensors are installed to face in opposite directions at the left and right sides, respectively, of a vehicle so as to respond only to excessive deceleration.

Figure 7A:
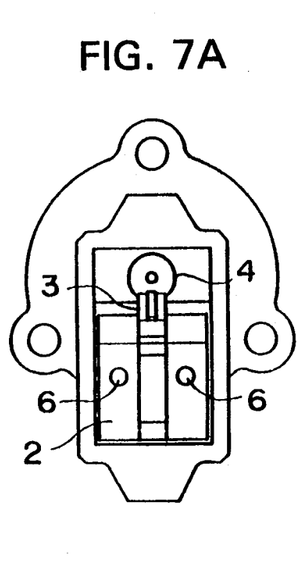
FIGS. 7A to 7C are a rear view showing that the sensor of the embodiment can be rotated as desired about the axis thereof to determine a set-up posture of the sensor.
Figure 7B:
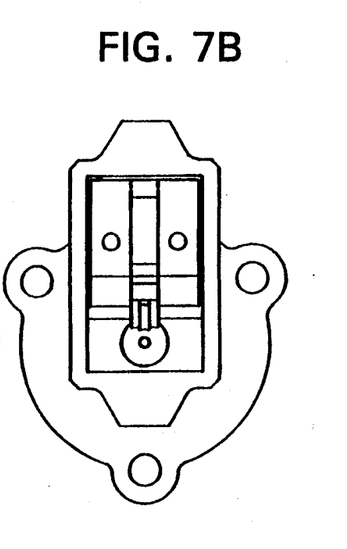
Figure 7C:
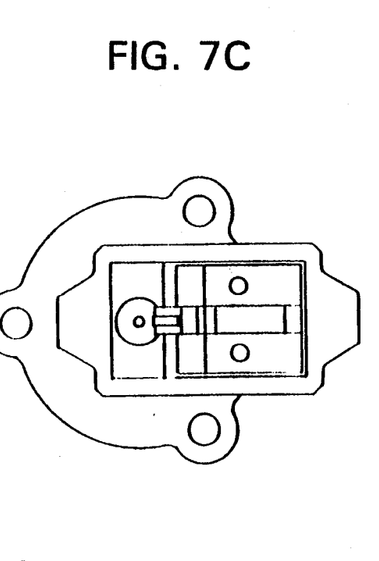

FIG. 7 show that the sensor can be set up in a posture which is established by properly rotating it about the axis of movement of the weight 2 or the firing pin 4. This capability of the sensor is obtained due to the fact that since the rotation of the weight 2 about the axis of movement thereof is prevented by the pair of guide members 6, the latch lever 3 and the weight 2 will not interfere with each other during the operation despite the complicated arrangement of the latch lever 3 and the weight 2. FIG. 7(A) shows a normal set-up posture of the sensor. FIG. 7(B) shows a set-up posture which is established by turning upside down the sensor in the normal set-up posture shown in FIG. 7(A). FIG. 7(C) shows a set-up posture which is established by turning sideways the sensor in the normal set-up posture. It should be noted that the sensor may assume a posture intermediate between the illustrated ones, as a matter of course. The elimination of the restriction on the set-up posture is mainly useful to increase the degree of freedom for set-up posture with which a retractor equipped with the sensor can be installed on a vehicle.

Figure 8A:
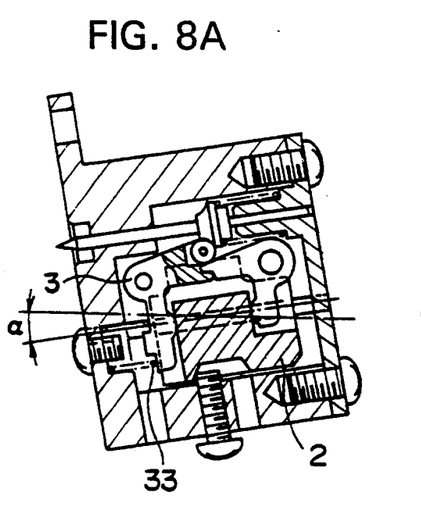
FIGS. 8A and 8B are a sectional side view showing that the sensor of the embodiment can be set up with the axis thereof vertically inclined at a predetermined angle, that is, the tilting angle can be adjusted.
Figure 8B:
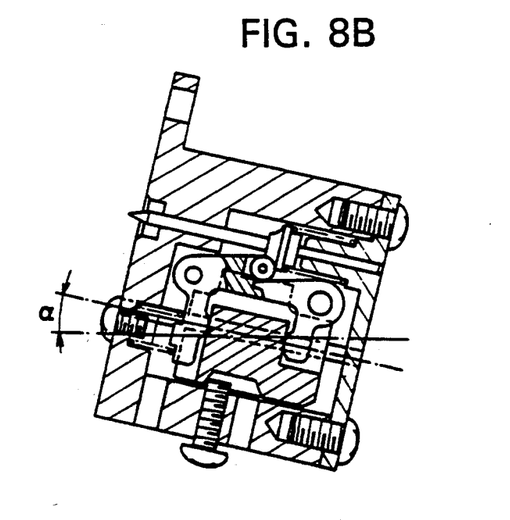

FIG. 8 shows that it is possible to set up the sensor with the longitudinal axis thereof vertically inclined at a predetermined angle with respect to that of the sensor installed in the normal set-up posture, that is, it is possible to adjust the typing angle α. In the sensor of this embodiment, the typing angle α can be changed within about 15° for each of the obliquely upward and downward set-up postures by adjusting the set spring load and the weight of the weight 2. FIG. 8(A) shows the sensor set up to face obliquely downward at an angle of 15°, and FIG. 8(B) shows the sensor set up to face obliquely upward at an angle of 15°. This capability of the sensor is obtained mainly due to the fact that the weight 2 is set in position without play so that no impact load will be applied to the latch lever 3 from the weight 2. The reduction in the limitation on the set-up posture can be used most effectively when a retractor equipped with the sensor is installed with an inclination in conformity to the inclination of the pillar of the vehicle.

Figure 9:
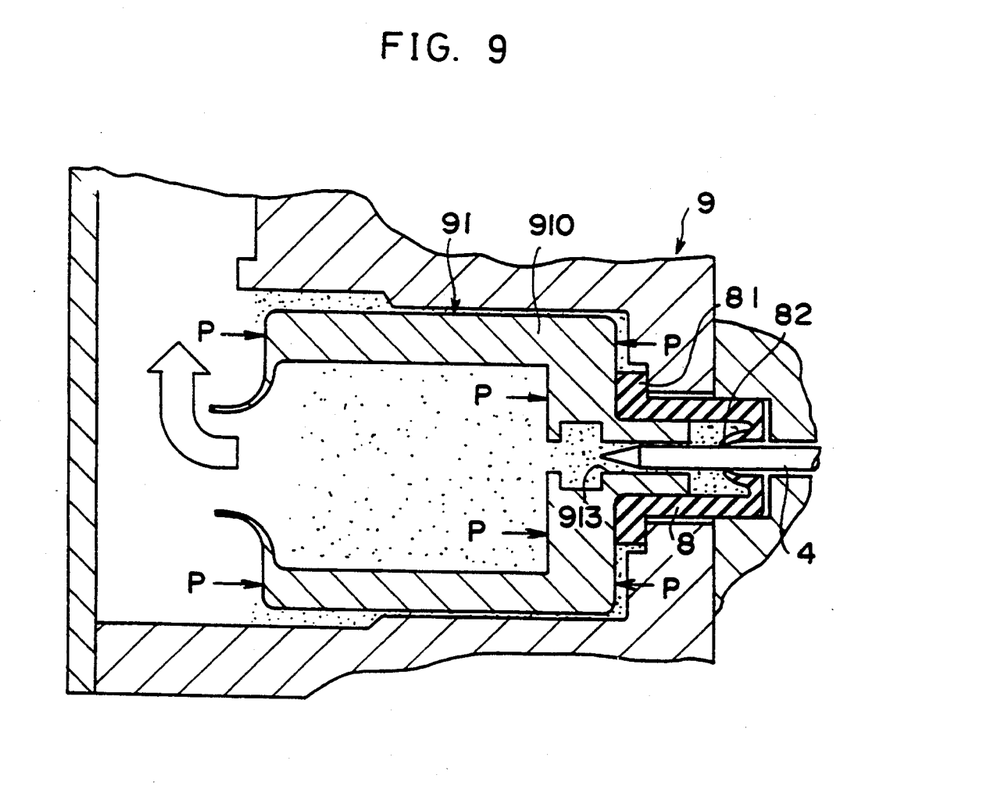
FIG. 9 is a sectional side view showing the gas-pressure seal function of the apparatus of the embodiment.

Finally, FIG. 9 shows a leak preventing action of the coupler seal 8 that utilizes the gas pressure produced by the gas generator 91. The gas that is generated by combustion of the gunpowder ignited by the percussive action of the firing pin 4 is introduced as a working gas into an actuator (not shown) of the pretensioner 9, as shown by the arrow in the figure. At this time, the gas pressure P also acts on the inner and outer sides of the casing 910 of the gas generator 91. As a result, the casing 910 is subjected to unbalanced force corresponding to the area A of the seal flange 81 of the coupler seal 8, i.e., P×A. This force acts as clamping force to the seal flange 81 and prevents leakage of gas from the rear of the casing 910. On the other hand, the pressure that enters the joint through the approach hole 913 presses the turnup portion of the coupler seal 8 backwardly. Therefore, turning moment acts on the turnup portion, which is supported at the outer peripheral side thereof in a cantilever manner, causing the inner diameter of the lip portion 82 to contract. Accordingly, the lip portion 82 is pressed against the outer periphery of the firing pin 4. Thus, leakage of the gas from the joint to the sensor is also prevented.

Although the present invention has been described above by way of one embodiment in which the present invention is applied to an activating apparatus for a pretensioner in a seatbelt system, it should be noted here that the present invention is not necessarily limited to the described embodiment and that it is also applicable, for example, to an inflator in an air bag system. Further, various changes and modifications may be imparted to the specific arrangement without departing from the scope of the invention which is limited solely by the appended claims.

What is claimed is:

1. A mechanical acceleration sensor comprising a weight movably supported on a casing, a latch lever movably supported on the casing, loaded with a set load and disposed to face said weight, a firing pin movably supported on the casing, spring-loaded by a spring and normally engaged with said latch lever, said latch lever being movable out of engagement with said firing pin against the set load by inertial movement of said weight relative to said casing, thereby allowing said firing pin to be moved by the spring and perform a percussive action, and a sublever coacting with said latch lever, said sub-lever being movably supported on the casing on a support and having a first portion disposed to face a side of said weight which is opposite to the side thereof that faces said latch lever, and having a second portion coupled to said latch lever on the opposite side of the support from the first portion so as to cooperate with said latch lever to clamp said weight from both sides of the direction of inertial movement of said weight.

2. A mechanical acceleration sensor comprising a weight movably supported on a casing, a latch lever movably supported on the casing, loaded with a set load and disposed to face said weight, a firing pin movably supported on the casing, spring-loaded by a spring and normally engaged with said latch lever, said latch lever being movable out of engagement with said firing pin against the set load by inertial movement of said weight relative to said casing, thereby allowing said firing pin to be moved by the spring and perform a percussive action, and setting means disposed in connection with said latch lever for enabling the position of engagement between said latch lever and said firing pin to be adjusted from the outside of said casing.

3. A mechanical acceleration sensor comprising a weight movably supported on a casing, a latch lever movably supported on the casing, loaded with a set load and disposed to face said weight, and a firing pin movably supported on the casing, spring-loaded and normally engaged with said latch lever, said latch lever being movable out of engagement with said firing pin against the set load by inertial movement of said weight relative to said casing, thereby allowing said firing pin to perform a percussive action, and said weight being supported on said casing through a guide member that prevents rotation of said weight about an axis in the direction of inertial movement thereof.

4. A mechanical acceleration sensor comprising a weight movably supported on a casing, a latch lever movably supported on the casing, loaded with a set load and disposed to face said weight, and a firing pin movably supported on the casing, spring-loaded and engaged with said latch lever, said latch lever being movable out of engagement with said firing pin against the set load by inertial movement of said weight relative to said casing, thereby allowing said firing pin to perform a percussive action, said latch lever being engaged with said firing pin through a roller.

5. A gas-pressure activating apparatus comprising a gas generator having a housing and a case received in a cavity in said housing and containing gun powder, a mechanical acceleration sensor having a casing attached to the housing of said gas generator, and coupler seal means disposed in a juncture between said housing and said casing for preventing a gas generated by said gas generator when activated from leaking out through said juncture, said coupler seal means including a flange portion received in the cavity between the housing and the case, whereby gas pressure generated by combustion of the gun powder applies an unbalanced force to the case so as to apply a clamping force to said flange portion of the coupler seal means.

6. Apparatus according to claim 5 wherein the mechanical acceleration sensor includes a spring-loaded firing pin and the coupler seal means includes a sealing lip portion engaging the firing pin so as to prevent gas generated by combustion of the gun powder from leaking from the housing past the firing pin.

* * * * *